(12) United States Patent
Lin

(10) Patent No.: US 6,228,707 B1
(45) Date of Patent: May 8, 2001

(54) SEMICONDUCTOR ARRANGEMENT HAVING CAPACITIVE STRUCTURE AND MANUFACTURE THEREOF

(75) Inventor: Xi-Wei Lin, Fremont, CA (US)

(73) Assignee: Philips Semiconductors, Inc., Tarrytown, NY (US)

( * ) Notice: Subject to any disclaimer, the term of this patent is extended or adjusted under 35 U.S.C. 154(b) by 0 days.

(21) Appl. No.: 09/337,151

(22) Filed: Jun. 21, 1999

(51) Int. Cl.[7] .............................................. H01L 21/8242
(52) U.S. Cl. ...................... 438/250; 438/393; 438/622; 438/623; 438/626; 438/629; 438/631; 438/633; 438/634; 438/637
(58) Field of Search ................................ 438/250, 393, 438/626–641

(56) References Cited

U.S. PATENT DOCUMENTS 5,482,894 * 1/1996 Havemann ........................... 438/623
5,627,094   5/1997 Chan et al. .
5,960,316 * 9/1999 Bai ....................................... 438/633
6,077,770 * 6/2000 Hsu ...................................... 438/622

FOREIGN PATENT DOCUMENTS 0 892 442 A1   1/1999 (FR) .

* cited by examiner

*Primary Examiner*—John F. Niebling
*Assistant Examiner*—Jennifer M. Kennedy

(57) ABSTRACT

A semiconductor manufacturing process is used to develop capacitors in compact areas such as at or near the interconnect level. According to one example embodiment, a substrate having a first and second conductor is separated by a dielectric, once the dielectric is removed a trench is formed, and a first material including silicon nitride is deposited over the substrate so that it covers the trench. A second material, including metal, is then deposited over the first material, covering it and the first and second conductors. CMP is then used to remove the metal over the field and isolate the filled metal from adjacent metals causing the silicon nitride to act as a natural CMP etch-stopper and protecting other areas of the interconnect from damage by the CMP.

22 Claims, 2 Drawing Sheets

SEMICONDUCTOR ARRANGEMENT HAVING CAPACITIVE STRUCTURE AND MANUFACTURE THEREOF

FIELD OF THE INVENTION

This invention relates to semiconductor devices and their manufacture and, more particularly, to such devices incorporating, and processes for developing, capacitors at or near the interconnect level.

BACKGROUND OF THE INVENTION

The electronics industry continues to rely upon advances in semiconductor technology to realize higher-functioning devices in more compact areas. For many applications, realizing higher-functioning devices requires integrating a large number of electronic devices into a single silicon wafer. As the number of electronic devices per given area of the silicon wafer increases, the manufacturing process becomes more difficult.

A large variety of semiconductor devices have been manufactured having various applications in numerous disciplines. Such silicon-based semiconductor devices often include metal-oxide-semiconductor (MOS) transistors, such as p-channel MOS (PMOS), n-channel MOS (NMOS) and complimentary MOS (CMOS) transistors, bipolar transistors, and BiCMOS transistors.

Each of these semiconductor devices generally includes a semiconductor substrate on which a number of active and passive devices are formed. The particular structure of a given active device can vary between device types. For example, in MOS transistors, an active device generally includes source and drain regions and a gate electrode that modulates current between the source and drain regions. Passive on-chip devices, such as capacitors and resistors, are typically strategically placed to interact with the active devices.

One important step in the manufacture of such devices is the formation of capacitors as a closely integrated part of the semiconductor device. Passive on-chip capacitors are desirable components four analog or mixed-signal circuit designs. In a CMOS based technology, capacitors are generally made using the MOS gate itself, with poly and substrate acting as the two electrodes and gate oxide as the dielectric.

There are at least two drawbacks of such gate capacitors. First, gate capacitors directly use the silicon real estate and thus increase the chip size and cost. Second, gate capacitors are not inherently passive, since the capacitance is dependent on the gate voltage the capacitance value may vary. Alternatively, capacitors could be made at the interconnect levels, where there often are spaces to accommodate extra elements without increasing the silicon area. Capacitors made of metal pieces would be truly passive with constant values. One possible structure of interconnect capacitance consists of two parallel metal lines with dielectric between them. A problem with this approach is that the spacing between two metal lines generally has a minimum value defined by the process technology. Disadvantageous to the relatively small chip area, without reducing the inter-metal spacing, long metal lines have been typically required to achieve sufficient capacitance values.

Accordingly, there is a need for semiconductor structures, and manufacturing processes therefor, that overcome the aforementioned disadvantages of the prior art.

SUMMARY

According to various aspects of the present invention, embodiments thereof are exemplified in the form of semiconductor manufacturing processes for developing capacitors in compact areas such as at or near the interconnect level. One specific implementation directed to such manufacture begins with a substrate having first and second conductors separated by a temporary material. The material that separates the first and second conductors is removed and a trench therebetween is formed. A first material, having a relatively high dielectric constant (e.g., higher than about 7.0) is deposited over the substrate so that first material covers the trench and the first and second conductors adjacent to the trench. A second material, including metal, is then deposited over the first material so that it covers the first material above the trench and the first and second conductors adjacent to the trench. The second material is removed, for example, by a selective etch process, and, while removing the second material, the first material is detected for termination of the removal or etching of the second material.

Another related process, also according to the present invention, includes: a starting structure prepared in a Damascene process consisting of metal lines with oxide filling the gaps. A commonly-used new planarization process in semiconductor device manufacturing is chemical-mechanical polishing, or CMP. CMP is useful in the planarization of silicon wafers and of VLSI circuits between different manufacturing processes. CMP is used in this application to remove metal over the field. A selective etch process is then performed to remove the oxide deposited between the metal lines over the area where the capacitor is to be made. Photolithography, a process involving the photographic transfer of a pattern to a surface for etching, masks all outside areas to prevent the circuit from being damaged. A dielectric of silicon nitride is then deposited on the surface, forming a thin nitride layer on the sidewall of the metal lines. Silicon nitride has a high dielectric constant "k" (about 7.5) enabling capacitor formation. Blanket metal deposition follows the deposit of the dielectric and fills the newly formed gaps. A CMP process is again used to remove metal over the field. Because silicon nitride acts as a natural CMP etch-stopper, the other areas of the interconnects are protected by possible damage done during this process.

In another example embodiment, the capacitors are made more efficient by cross-coupling the two finger structures where both sides of a metal line are utilized for capacitance. For example, in a specific implementation, this approach includes manufacturing a semiconductor device by providing a substrate having first and second metal conductors separated by a dielectric and arranged so that they are cross-coupled, with each of the first and second metal conductors including first and second surface sides facing the dielectric. Subsequent steps include: removing the dielectric that separates the first and second metal conductors and forming a trench therebetween; depositing a first material (such as silicon nitride), having a dielectic constant at least about 7.5, over the substrate so that first material covers the trench and the first and second metal conductors adjacent to the trench; depositing a second material, including metal, over the first material so that the second material covers the first material above the trench and the first and second metal conductors adjacent to the trench; removing the second material; and, while removing the second material, detecting the first material for terminating the removal of the second material.

In a more specific implementation, the first and second metal conductors form outside terminals of a two-capacitor structure, with the other material forming a common terminal interconnecting the two capacitors. The first material dielectrically separates the adjacent conductive areas that are used as the terminals.

In another more specific implementation, the first and second metal conductors form one terminal of a two-terminal capacitor structure, with the other material forming the other of the two terminals. The two terminals are dielectrically separated by the first material.

In one particular implementation found to be especially useful for a typical 0.20 micron technology, the first material is silicon nitride and removing the second material includes a selective etch process.

The above summary is not intended to provide an overview of all aspects of the present invention. Other aspects of the present invention are exemplified and described in connection with the detailed description.

BRIEF DESCRIPTION OF THE DRAWINGS

Various aspects and advantages of the present invention will become apparent upon reading the following detailed description of various embodiments and upon reference to the drawings in which.

Figure 1A:
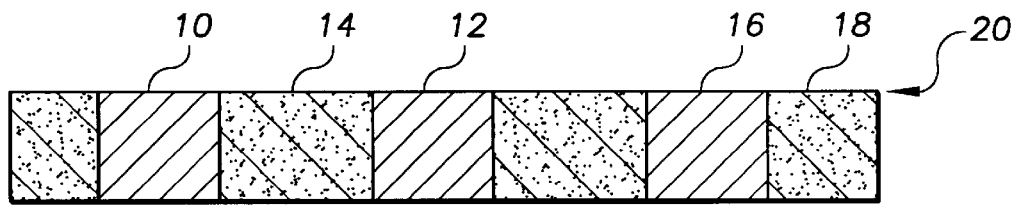
FIGS. 1a through 1e illustrate a process for forming a semiconductor structure, shown from a cross-sectional view, according to one example embodiment of the present invention.

While the invention is amenable to various modifications and alternative forms, specifics thereof have been shown by way of example in the drawings and will be described in detail. It should be understood, however, that the intention is not to limit the invention to any particular embodiment described. On the contrary, the invention is to cover all modifications, equivalents, and alternatives falling within the spirit and scope of the invention as defined by the appended claims.

DETAILED DESCRIPTION

The present invention may be applied to a variety of semiconductor structures involving the formation of capacitors in compact integrated circuit areas. The present invention has been found to be particularly advantageous for use in connection with forming capacitors having relatively high capacitance values in compact integrated circuit areas, such as at or near the interconnect level. While the present invention is not so limited, various aspects of the invention are best appreciated through a discussion of application examples in such an environment.

According to one example embodiment of the present invention, a process of fabricating a semiconductor structure implements a capacitor structure using a dielectric between regions defining first and second conductors, and implementing one of the terminals of the capacitor structure as a metal-filled trench. Initially, a temporary material (such as a conductor or a dielectric) separates the regions corresponding to the first and second conductors. The temporary material is then removed, e.g., via etching or ion bombardment, to form a trench. A dielectric material having a relatively high dielectric constant is then deposited over the substrate so that the dielectric material covers the trench and the first and second conductors adjacent to the trench. A conductive material is then deposited to cover the dielectric material in the trench and over the first and second conductors adjacent to the trench. The conductive material fills the trench along a lining or layer of the dielectric material. A substrate removal process, for example, a selective or metal etch process, is then used to remove the conductive material over the trench until the dielectric material having a relatively high dielectric constant is detected on the surface of the structure.

The resultant structure is a capacitor structure defined by the terminals (conductive material) on either side of the high-dielectric material and in the trench. This high-dielectric material has an inside surface defining the bottom and sides of the trench. In one more specific example embodiment, the first and second conductors facing the outside surface of the trench are electrically interconnected to define one of the terminals, and the other terminal is defined by the conductive material filling the trench. In another more specific example embodiment, the first and second conductors facing the outside surface of the trench are electrically isolated from one another, and the capacitor structure includes two serially-connected capacitors. Each of the two serially-connected capacitors shares a common center terminal defined by the conductive material filling the trench, and the other terminal of each of the two serially-connected capacitors is respectively defined by one of the first and second conductors facing the outside surface of the trench.

Advantageously, in each of these more specific embodiments, the inside surface of the dielectric material has an actual length defined along the bottom and sides of the trench, and an effective length that is not longer than the width of the trench.

Turning now to the figures, FIGS. 1a–1e illustrate an example process, according to the present invention, for forming a capacitor structure having one terminal defined by a trench-filled conductor, a material having a high-dielectric constant, and another terminal defined by a pair of conductors. FIG. 1a illustrates the pair of conductors including first conductor 10 and second conductor 12, with an insulative or dielectric material 14 separating the pair of conductors. The illustrated substrate can include other metal lines 16 (e.g., an interconnect line) with insulative or dielectric material 18 filling the areas between such lines as shown in FIG. 1a.

In the example process of FIGS. 1a–1e, the illustrated structure is planarized to expose the metal lines at a surface 20. Such planarization can be implemented by a conventional polishing technique, such as by chemical-mechanical polishing (CMP). A planarized structure as shown in FIG. 1a is naturally prepared in a Damascene process in which metal lines are patterned by laying metal in oxide trenches and CMP to remove metal over the field.

Figure 1B:
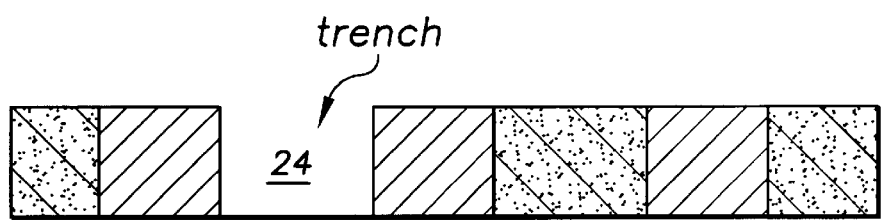

Next, the dielectric material 14 between metal conductors (or "lines" as the application may require) 10 and 12 is removed to form a trench in the area where the desired capacitor structure is to be made. Trenching the structure, particularly the dielectric material 14, can be accomplished in a number of different ways. Trenches are typically formed in the silicon through the use of well-known photolithography and etching techniques. In an example implementation consistent with the example process depicted by FIGS. 1a–1e, a conventional selective etch process is used to remove the oxide 14 between metal lines 10 and 12 (FIG. 1b). The areas outside the oxide 14 is masked off by photolithography, and the selective etch process, by definition, is selective to etch only the oxide. The resultant trench is depicted as 24 in FIG. 1b.

Other etching processes can also be used. However, in advanced, deep-submicron manufacturing processes, it is important to terminate the etching at a precise depth, and this is readily achieved using a conventional endpoint detection system. When etching one film on top of a different film (such as the oxide on top of an underlying material that is not shown in the FIGS. 1a–1e), the amount of light for one particular wavelength emitted by the plasma changes as the upper film is being etched away. This wavelength of light corresponds to one of the products during the plasma etch process. The endpoint detection system is used to detect the changes of that one particular wavelength of the light during the plasma etching process. There are two conditions that apply to such an endpoint detection system: the film on the top to be etched has finite thickness relative to the etchrate of the film; and there is another film of a different type underneath the film to be etched. Therefore, as the top film is being etched away, the products change and this, in turn, changes the amount of the light emitted by those products. As a result, the endpoint detection system can pick up the changes in the intensity of the light and terminate the etching process when the top film is completely etched away.

In an alternative embodiment of the present invention, the structure of FIG. 1a is modified in that the dielectric material 14 is replaced by a metal material, and a trench is provided therein using a conventional metal-etch process, e.g., with a timed endpoint termination that stops short of etching the metal material completely away by leaving a metal layer defining the bottom of the trench. In an example implementation, the metal layer has a thickness that is a few-to-several percentage points of its original thickness after planarization. This metal layer defining the bottom of the trench is used to form an electrical interconnection of the metal conductors 10 and 12.

Another alternative approach to interconnecting the metal conductors 10 and 12, also according to the present invention, does not involve providing this metal region and then etching to form a metal layer defining the bottom of the trench. Rather, the structure of FIG. 1a is formed over an underlying layer that includes a conductor interconnecting the metal conductors 10 and 12. This underlying layer defines the bottom of the trench and is used to form an electrical interconnection of the metal conductors 10 and 12.

The resultant structure of these two alternative approaches differs from the resultant structure depicted by the approach illustrated in connection with FIGS. 1a–1e. In each of these two alternative approaches, the structure being formed is a single capacitor having its terminals as the conductive material on either side of the trench. The resultant structure depicted by the approach illustrated in connection with FIGS. 1a–1e has the first and second conductors facing the outside surface of the trench as two of three electrically isolated terminals arranged to form two serially-connected capacitors.

Figure 1C:
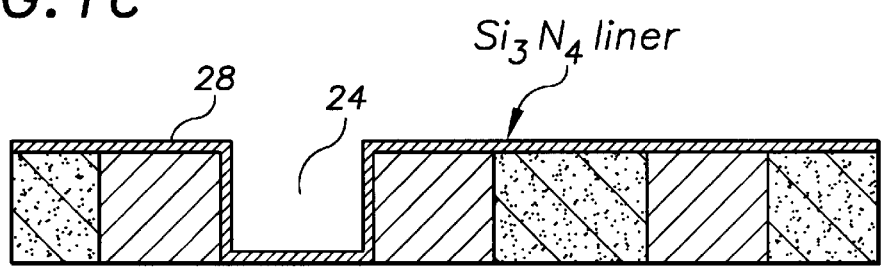

For each of the above-discussed alternative embodiments, once the trench is defined, next in the example process and as depicted by FIG. 1c, silicon nitride is deposited on the surface of the structure to form a thin nitride layer on the sidewall of metal lines. This thin nitride layer (or liner) is depicted as layer 28 in FIG. 1c.

Figure 1D:
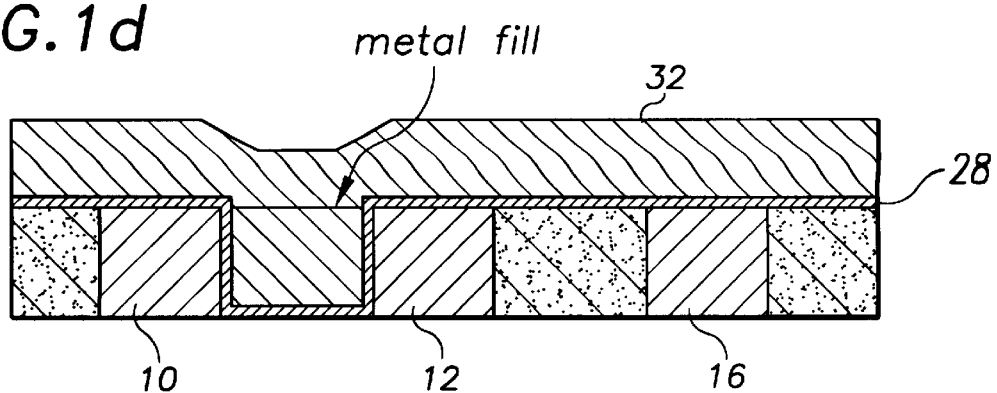

As shown in FIG. 1d, blanket deposition of metal 32 follows to fill the newly formed trench 24.

For an alternative application where multiple trenches are being formed in place of removed oxide in the other positions (for example, in the structure of FIG. 1a), silicon nitride is deposited on the surface to form a thin nitride layer on the sidewall of the metal lines and with each trench that is formed. The subsequent blanket metal deposition then fills each of the newly formed trenches.

Figure 1E:
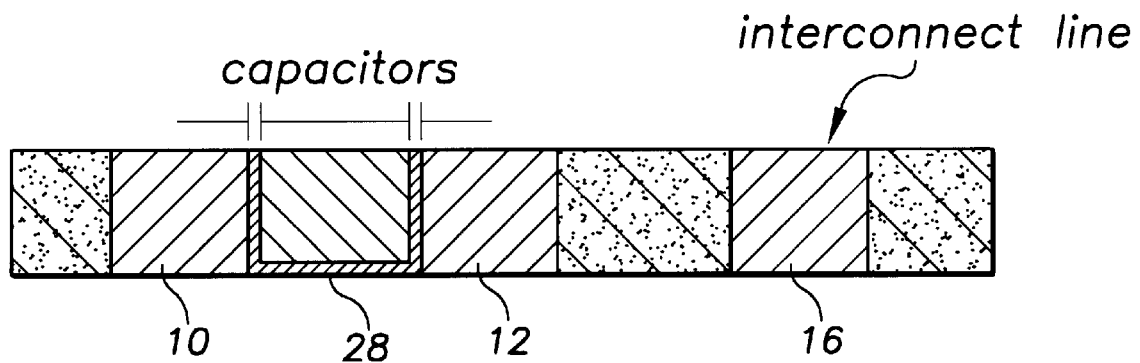

CMP is then used to remove the metal over the field and isolate the filled metal from adjacent metals (FIG. 1e). In this step, the underlying silicon nitride naturally acts as a CMP etch-stopper, so that other areas of the interconnects are protected from damage by CMP.

While another type of dielectric can be chosen, in the above example implementation silicon nitride is chosen as the dielectric because of its high dielectric constant ("k" being about 7.5) which enables compact capacitor formation. The metal capacitors can be compared with gate capacitors in terms of area usage. For the same capacitance value, it can be shown that the metal length is only half the gate width, i.e., $L_m$ approximately $0.5W_g$, for a typical sub-micron technology with the following conditions: oxide dielectric constant k is equal to 4.0, the gate oxide thickness Tox is equal to 40 Å, the gate length Lg is 0.2 $\mu$m, the silicon nitride thickness $T_{SiN}$ is equal to 100 Å, and the metal thickness Tm is equal to 0.5 $\mu$m.

In an alternative implement ation, also according to the present invention, the capacitors are made more efficient by cross-coupling first and second conductors as two finger structures where both sides of a metal line are utilized for capacitance. For example, in a specific implementation, this approach includes manufacturing a semiconductor device by providing a substrate having first and second metal conductor s separated by a dielectric and arranged so that they are cross-coupled, with each of the first and second metal conductors including first and second surface sides facing the dielectric. Subsequent steps include: removing the dielectric that separates the first and second metal conductors and forming a trench therebetween; depositing a first material (such as silicon nitride), having a dialectic constant of at least about 7.5, over the substrate so that first material covers the trench and the first and second metal conductors adjacent to the trench; depositing a second material, including metal, over the first material so that the second material covers the first material above the trench and the first and second metal conductors adjacent to the trench; removing the second material; and, while removing the second material, detecting the first material for terminating the removal of the second material.

Figure 2:
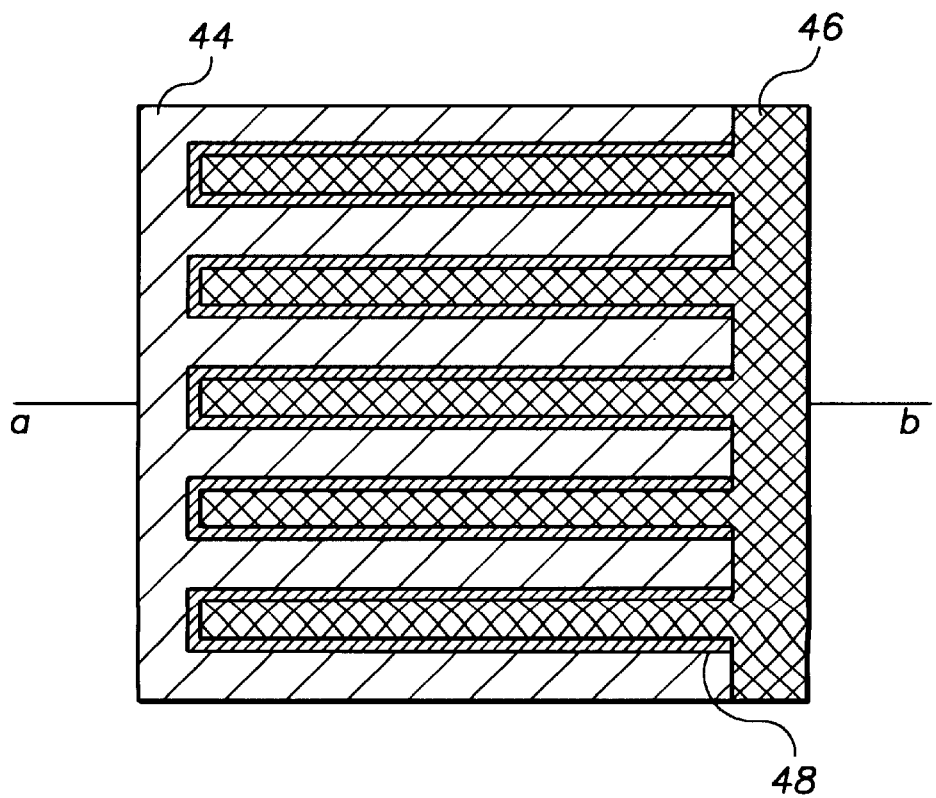
FIG. 2 illustrates an example embodiment of a cross-coupled metal capacitor, shown from a top-down view, according to the present invention.

FIG. 2 shows a resultant capacitor structure with terminals "a" and "b" on either side of such a structure including two cross-coupled metal structures 44 and 46 separated by a high-dielectric material 48. In this illustrated example, the cross-coupled metal structure 44 includes seven fingers, and the cross-coupled metal structure 46 includes six fingers. It will be appreciated that the number of fingers for each of these cross-coupled metal structures can vary.

The various embodiments described above are provided by way of illustration only and are not intended to limit the invention. Those skilled in the art will readily recognize various modifications and changes that may be made to the present invention without strictly following the example embodiments and applications illustrated and described herein. The scope of the present invention is set forth in the following claims.

What is claimed is:

1. A method of manufacturing a semiconductor device having a capacitive structure including a substrate having a first conductor and a second conductor, comprising:

removing a temporary material that separates the first and second conductors and forming a trench therebetween;

depositing a first material, having a dielectric constant at least about 7.5, over the substrate so that the first material covers the trench and the first and second conductors adjacent to the trench;

depositing a second material, including metal, over the first material so that it covers the first material above the trench and the first and second conductors adjacent to the trench;

removing the second material; and while removing the second material, detecting the first material; and in response, terminating the step of removing the second material.

2. A method of manufacturing a semiconductor device, according to claim 1, wherein the first material includes silicon nitride and wherein the temporary material separating the first and second conductors is a conductor.

3. A method of manufacturing a semiconductor device, according to claim 1, further including exposing the first and second conductors by planarizing an overlying surface.

4. A method of manufacturing a semiconductor device, according to claim 1, wherein further including patterning the first conductor and the second conductor by laying conductive material in dielectric trenches and by surface planarizing overlying conductive material.

5. A method of manufacturing a semiconductor device, according to claim 1, wherein each of the first and second conductors is a metal material, and further including using a Damascene process in which the first conductor and the second conductor are patterned by laying the metal material in dielectric trenches and by CMP (chemical-mechanical polishing) overlying metal material.

6. A method of manufacturing a semiconductor device, according to claim 5, wherein removing the temporary material includes selective etching.

7. A method of manufacturing a semiconductor device, according to claim 1, wherein removing the second material includes selective etching.

8. A method of manufacturing a semiconductor device, according to claim 1, wherein the first material is silicon nitride.

9. A method of manufacturing a semiconductor device, according to claim 8, wherein depositing silicon nitride over the substrate includes forming a thin layer of silicon nitride over the trench and the first and second conductors.

10. A method of manufacturing a semiconductor device having a capacitive structure, comprising:

patterning a first conductor and a second conductor by laying a conductive material with a dielectric separating the first and second conductors;

planarizing the conductive material to expose the first and second conductors;

etching at least a majority of the dielectric that separates the first and second conductors and forming a trench therebetween;

depositing silicon nitride over the substrate so that the silicon nitride covers the trench and the first and second conductors adjacent to the trench;

depositing another material, including metal, over the silicon nitride so that the other material covers the silicon nitride above the trench and the first and second conductors adjacent to the trench;

etching away the other material; and while removing the other material, detecting the silicon nitride; and in response, terminating the step of removing the other material and forming a multi-terminal capacitor structure including at least two terminals dielectrically separated by the silicon nitride.

11. A method of manufacturing a semiconductor device, according to claim 10, wherein planarizing conductive material to expose the first and second conductors includes chemical-mechanical polishing.

12. A method of manufacturing a semiconductor device, according to claim 11, wherein the dielectric separating the first and second conductors is an oxide.

13. A method of manufacturing a semiconductor device, according to claim 12, wherein etching away the other material includes selective etching.

14. A method of manufacturing a semiconductor device, according to claim 13, wherein the silicon nitride has a dielectric constant of at least about 7.5.

15. A method of manufacturing a semiconductor device, according to claim 14, wherein the dielectric separating the first and second conductors has a dielectric constant of at least about 4.0.

16. A method of manufacturing a semiconductor device, according to claim 15, wherein depositing silicon nitride over the substrate includes forming a layer of silicon nitride over the trench and the first and second conductors, the layer of silicon nitride having a thickness of about 100 Angstroms.

17. A method of manufacturing a semiconductor device, according to claim 10, wherein forming a multi-terminal capacitor structure includes forming two terminals with the first and second conductors electrically interconnected to function as one of two terminals, and the other material as the other of the two terminals.

18. A method of manufacturing a semiconductor device, according to claim 10, wherein forming a multi-terminal capacitor structure includes forming three terminals with the first and second conductors electrically isolated and functioning as two terminals, and with the other material as a common terminal opposite each of the two terminals.

19. A method of manufacturing a semiconductor device having a capacitive structure, comprising:

providing a substrate having a first metal conductor and a second metal conductor, the first and second metal conductors separated by a dielectric and cross-coupled, each of the first and second metal conductors including first and second surface sides facing the dielectric;

removing the dielectric that separates the first and second metal conductors and forming a trench therebetween;

depositing a first material, having a dielectric constant at least about 7.5, over the substrate so that first material covers the trench and the first and second metal conductors adjacent to the trench;

depositing a second material, including metal, over the first material so that the second material covers the first material above the trench and the first and second metal conductors adjacent to the trench;

removing the second material; and while removing the second material, detecting the first material; and in response, terminating the step of removing the second material.

20. A method of manufacturing a semiconductor device, according to claim 19, wherein the first and second metal conductors from one terminal of a two-terminal capacitor structure, wherein the other material form the other of the two terminals, and wherein the two terminals are dielectrically separated by the first material.

21. A method of manufacturing a semiconductor device, according to claim 19, wherein the first material includes silicon nitride.

22. A method of manufacturing a semiconductor device, according to claim 20, wherein the first material is silicon nitride and wherein removing the second material includes a selective etch process.

* * * * *